United States Patent
Desbonnets et al.

(10) Patent No.: US 6,700,443 B2
(45) Date of Patent: Mar. 2, 2004

(54) REDUCTION OF SENSITIVITY OF AN AMPLIFIER TO AN OFFSET VOLTAGE

(75) Inventors: Eric Bernard Marie Francois Desbonnets, Caen (FR); Guillaume Lebailly, La Lande sur Drome (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/188,763

(22) Filed: Jul. 3, 2002

(65) Prior Publication Data

US 2003/0006840 A1 Jan. 9, 2003

(30) Foreign Application Priority Data

Jul. 4, 2001 (FR) .......................................... 01 08894

(51) Int. Cl.[7] .............. H03F 1/26; H03F 1/30
(52) U.S. Cl. .................. 330/149; 330/11; 327/307
(58) Field of Search ..................... 330/132, 11, 136, 330/149; 327/307, 306, 72, 317

(56) References Cited

U.S. PATENT DOCUMENTS 5,334,947 A * 8/1994 Werrbach .................... 330/149

* cited by examiner

*Primary Examiner*—Long Nguyen
(74) *Attorney, Agent, or Firm*—Michael J. Ure

(57) ABSTRACT

The invention relates to a method of amplifying an input signal having a DC component and an AC component. The method includes the steps of: comparing the input signal with a reference value, generating an intermediate signal by subtracting from the input signal a correction signal resulting from the comparison step, rectifying the intermediate signal, evaluating a mean value of the rectified intermediate signal, and multiplying the input signal by the mean value. The invention allows a reduction in the sensitivity of the amplifier to the DC component of the input signal.

6 Claims, 3 Drawing Sheets

REDUCTION OF SENSITIVITY OF AN AMPLIFIER TO AN OFFSET VOLTAGE

FIELD OF THE INVENTION

The invention relates to a method of amplifying an input signal having a DC component and an AC component.

The invention applies more particularly to integrated circuits for processing audio signals. It therefore relates particularly to transmission and reception circuits for wireless telephones.

BACKGROUND OF THE INVENTION

These circuits generally use a device for optimizing the bandwidth and improving the signal to noise ratio of the demodulated signal. This device consists of two units: a compressor for the transmission part and an amplifier also called expander for the reception part. These two units are very sensitive to offset voltages. Thus these two units are in general coupled to a capacitance which serves as a high-pass filter, so that any offset introduced by previous units is canceled out. This implementation has the advantage of canceling out the offset but costs an external capacitor and two connection pads.

SUMMARY OF THE INVENTION

One aim of the invention is to make it possible to reduce the sensitivity of the amplifier to voltage offset without using such a coupling with a capacitor.

A method of amplifying an input signal having a DC component and an AC component is characterized according to the invention in that it includes the following steps:

comparing the input signal with a reference value, generating an intermediate signal by subtracting from the input signal a so-called correction signal resulting from said comparison, rectifying the intermediate signal, evaluating a mean value of the rectified intermediate signal, multiplying the input signal by said mean value.

The method according to the invention proposes in fact a compromise which takes account of the change over time in the input signal in order to eliminate an offset voltage. The value of the input signal is compared at each moment with a reference value and this comparison causes the generation of a correction current. The invention makes it possible to avoid using a capacitor which is external and consequently expensive to use. The invention also makes it possible to avoid the multiplication of connection pads which are sources of error during manufacture.

Moreover, the invention presents a supplementary and important advantage of squelch reduction for the amplification according to the method of the invention. This advantage is particularly interesting for audio reception applications.

In one of its applications, the invention also relates to a device including modules for performing the functions according to the invention. More generally, the present invention can advantageously be implemented in an apparatus, for example a wireless telephone, whose reception chain comprises elements liable to introduce an offset within the processing of the signal received.

BRIEF DESCRIPTION OF THE DRAWINGS

The invention will be further described with reference to examples of embodiment shown in the drawings to which, however, the invention is not restricted.

DETAILED DESCRIPTION OF THE INVENTION

The description which follows is presented so as to enable a person skilled in the art to implement and use the invention. This description is provided in the context of the patent application and its requirements. Various alternatives to the preferred embodiment will be obvious to a person skilled in the art and the generic principles of the invention disclosed here can be applied to other implementations.

Thus the present invention is not deemed to be limited to the embodiment described, but rather to have the broadest scope in accordance with the principles and features described below.

Figure 1:
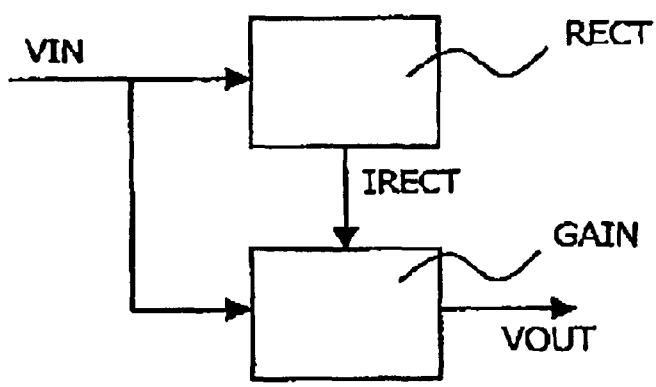
FIG. 1 is a block diagram describing the conventional functioning of an amplifier for reception.

FIG. 1 is a block diagram illustrating the conventional functioning of an amplifier as generally implemented for analog processing of the audio signal. The amplifier includes a rectification unit RECT which rectifies the input signal and filters the rectified signal in order to obtain the mean value IRECT of the rectified signal. IRECT is the output signal of the unit RECT. A gain unit GAIN then multiplies the input signal by this mean value IRECT. In the preferred embodiment, the input signal is a voltage. An offset voltage is defined by a voltage which is continuous over time added to the so-called useful signal which has a given frequency as a function of its utility. The offset voltage is a parasitic voltage generally caused by the presence of other functionalities along the audio data analog processing chain.

Figure 2:
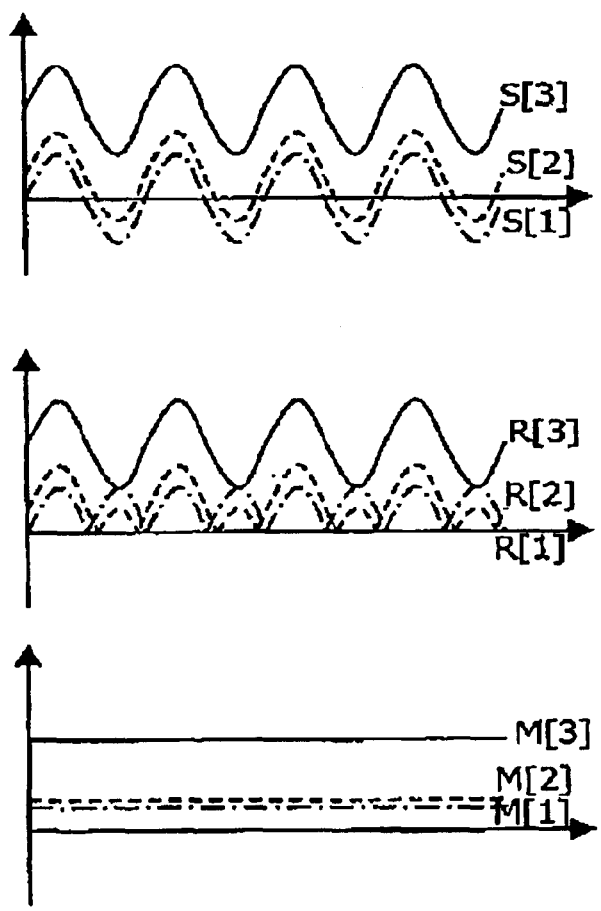
FIG. 2 illustrates the functioning of a conventional amplifier without correction for high-amplitude signals.
Figure 3:
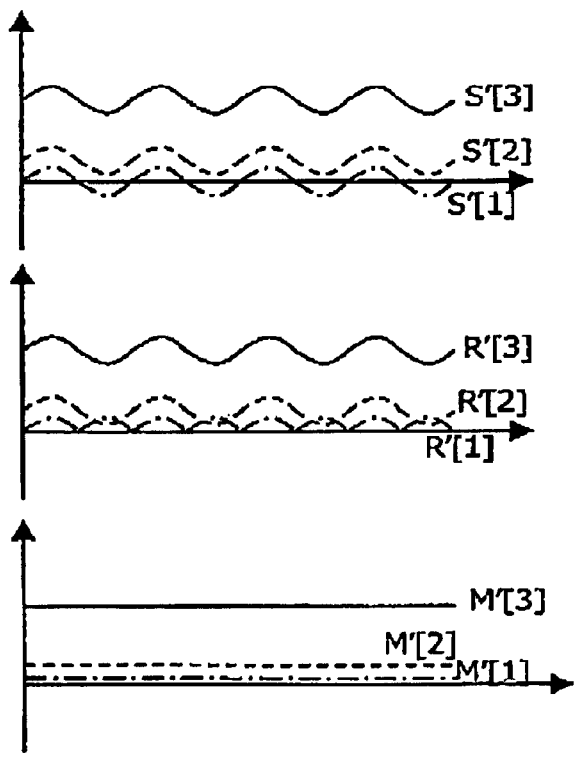
FIG. 3 illustrates the functioning of a conventional amplifier without correction for low-amplitude signals.

If there is no offset voltage in the input signal VIN, the latter is written according to the value of the data signal VSIG: $VIN(t)=|VSIG|.\sin\omega SIG.t$. This voltage is supplied at the input of the two units RECT and GAIN. The unit RECT then generates a current $IRECT=\alpha.|VSIG|=\alpha.|VIN|$ proportional to the mean value of the input signal. This is especially illustrated by the curves S[1], R[1] and M[1] in FIG. 2 and S'[1], R'[1] and M'[1] in FIG. 3. M[1] and M'[1] are the mean values IRECT sent to the unit GAIN. The unit GAIN then multiplies the input voltage by IRECT. Consequently, the output signal $VOUT=|VOUT|$ is such that $|VOUT|=\alpha.|VIN|^2$. The latter expression is the amplification ideally achieved by an amplifier in for example an audio signal reception chain.

If the input signal contains an offset voltage VOFF, the output of the rectification unit RECT is false since it is such that $IRECT=\alpha.|VSIG|+\beta$, where $\beta=\alpha.|VOFF|$. For high values of $|VSIG|$ the impact on the final result of the amplification is small. On the other hand, this becomes critical for the low input amplitudes and in particular for the input noise. The function of the amplifier, consisting in particular of reducing the input noise, will therefore be greatly degraded.

Actually, for an input VIN such that:
VIN=VSIG+VOFF where VSIG has a high amplitude compared with VOFF, IRECT=α.|VSIG|+β≈=α.|VSIG| since β=α.|VOFF| is negligible. The function of the amplifier is then correct and |VOUT| is proportional to |VSIG|², which is also close to |VIN|². This is for example illustrated, in the case of an offset voltage which is low compared with the amplitude of the signal, by the curves S[2], R[2] and M[2] in FIG. 2.

For an input signal such that VIN=VNOISE+VOFF, IRECT=α.|VNOISE|+β≈β since α.|VNOISE| is negligible. This is illustrated by the curves S[3], R[3] and M[3] in FIG. 2 (for an offset voltage which is high compared with the amplitude of the data signal) and S'[2], R'[2] and M'[2] as well as S'[3], R'[3] and M'[3] in FIG. 3 for low-amplitude input signals. In this case the noise is not reduced and the output at the amplifier is VOUT=β|VIN|=α.|VOFF| |VIN|≈α.|VOFF|². The output is therefore not proportional to |VSIG|² and is not correct. The amplifier therefore does not reject the signals of low amplitude.

A conventional solution to this problem consists of coupling the amplifier to a high-pass filter (a capacitor for example) so as to eliminate the DC components of the input signals. This is expensive in terms of integration space since this requires the presence of an external capacitor coupled to the amplifier and two additional connection pads.

Figure 4:
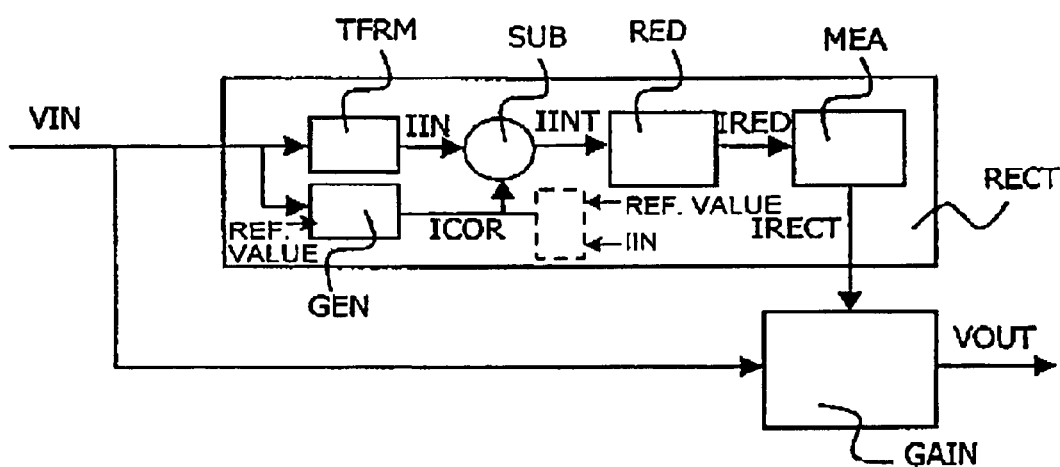
FIG. 4 is a block diagram of an amplifier with correction according to the invention.

Referring to FIG. 4, the invention proposes a particular structure of the rectification unit RECT. The chain of functions conventionally implemented within the unit RECT in the amplifiers consists of rectifying the input signal in a rectification step RED and then calculating the mean rectified signal IRECT in a step MBA. In the preferred embodiment, the input signal is a voltage VIN, and this voltage VIN is transformed into a current IIN, referred to as the input current, in a step TFRM. The latter step is performed by conventional voltage to current transformation means, for example by means of a resistor. This current is next rectified and averaged according to the chain of functions conventionally implemented. The invention proposes to add a feedforward path to the input of the rectification unit RECT. The implementation of this loop is advantageously achieved by means of a current generating unit GEN which receives as an input the input signal, here a voltage VIN, and which generates a so-called correction current ICOR. This current ICOR is then subtracted in a step SUB from the input current IIN. An intermediate current IINT is obtained, and this current is then rectified into a current TRED and averaged as a current IRECT in accordance with the chain of functions explained previously.

According to the invention, the correction current ICOR is generated by comparing the input signal VIN or IIN with a reference value.

Figure 5A:
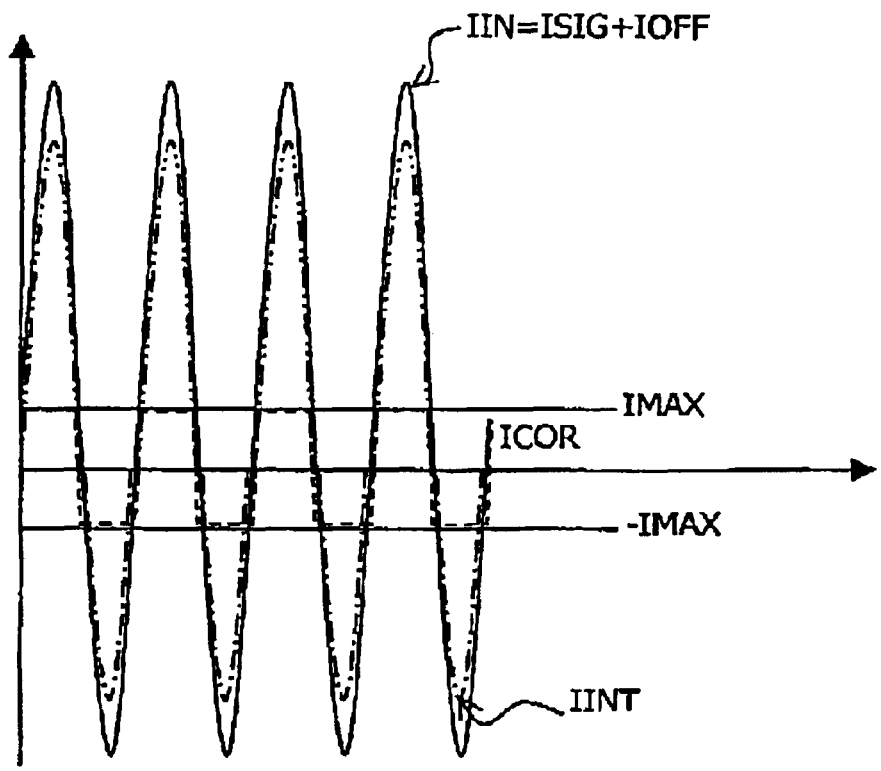
FIGS. 5a and 5b illustrates the generation of a correction signal according to the invention and the intermediate signal obtained according to the invention as well as the average of this rectified intermediate signal.
Figure 5B:
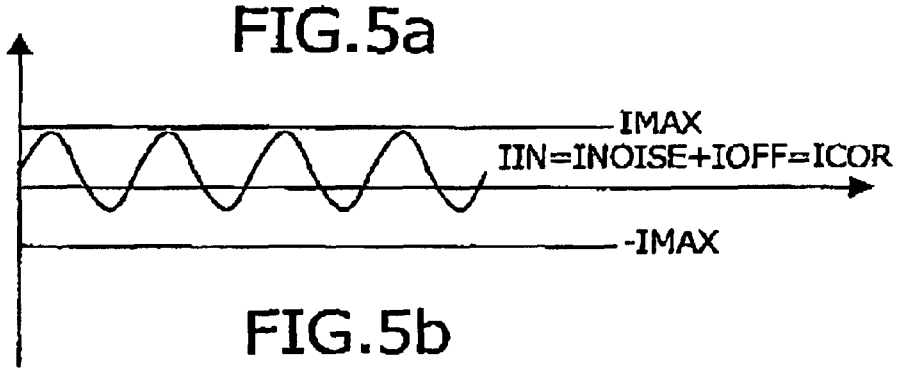

FIGS. 5a and 5b illustrates the generation of the correction current in three cases. FIGS. 5a and 5b, respectively, represent the generation of the correction currents for a high-amplitude input signal IN compared with the offset current IOFF (corresponding to the offset voltage VOFF) and for a low-amplitude signal (for which IINT is equal to zero), respectively. According to the invention, the current fiN is compared with a reference value IMAX. In the preferred embodiment of the invention and according to FIGS. 5a and 5b, the input current IN is compared at each moment with the reference value IMAX. For the values of IIN less than IMAX, ICOR is equal to IIN, and for the values greater than IMAX, ICOR is equal to IMAX. The alternating correction current thus obtained is next subtracted from the input current IIN in order to obtain an intermediate signal.

IMAX is chosen to compensate for the largest possible offset voltage (or the greatest possible offset current intensity in the case where the method uses current intensities). However, IMAX must not be too large since in this case high signal amplitudes may be eliminated. IMAX is therefore a compromise between these two quantities. In the applications concerned (reception chain and analog audio signal processing), a current intensity IMAX fixed at the maximum offset current intensity makes it possible not to obscure the high amplitudes to a significant extent. This is because the drawback of a high value is that the signals with amplitudes lower than this value are eliminated. An additional advantage of the invention consists of allowing a reduction in the squelch on amplification. This improves the quality of the sound of the receiver, for example when an earpiece is put at the output of the amplifier.

Effectively, the invention allows to obtain an amplification presenting a good quality and having a low sensitivity to offset as well as a squelch reduction. The circuit finally obtained is refined and consequently of a very good quality. Such an advantage can be decisive. The squelch reduction function is in fact provided by a fixing of IMAX at a value corresponding to a lower limit for the data signal. The squelch is rejected from the amplification as long as it is below the value of IMAX. The value IMAX can advantageously be fixed by hardware on the integrated circuit. FIGS. 5a and 5b also show the intermediate signal IINT obtained by subtraction of the correction current ICOR from the input current IIN and the average of the intermediate rectified signal IRECT. The invention therefore makes it possible to obtain a value of IRECT proportional to IVSIGI. In particular, the invention makes it possible to eliminate the contribution of the low-amplitude signals. The invention only very slightly affects the proportionality to IVSIGI for the signals of high amplitude.

Figure 6:
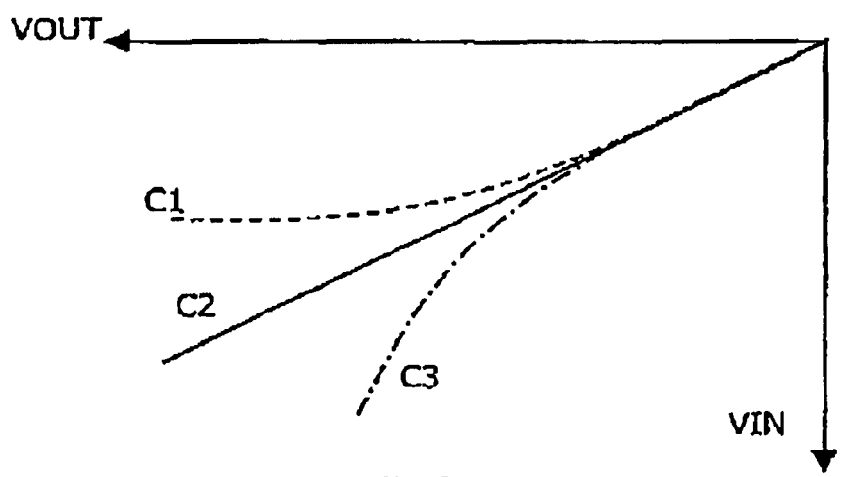
FIG. 6 is a gain diagram for illustrating the action of the correction of the amplification.

FIG. 6 illustrates such a behavior by presenting a gain diagram showing the amplification produced by a conventional amplifier to which a signal with offset voltage and without correction (C1) is presented, to which a signal without offset voltage and without correction (C2) is presented and with correction according to the invention (C3).

There are many ways of implementing the functions presented in the steps of the methods according to the invention by software and/or hardware means accessible to persons skilled in the art. This is why the figures are schematic. Thus, although the figures show various functions performed by various units, this does not exclude the fact that a single software and/or hardware means may make it possible to perform several functions. Nor does this exclude the fact that a combination of software means and/or hardware means may make it possible to fulfill a function.

Although this invention has been described in accordance with the embodiments presented, a person skilled in the art will immediately recognize that there are variants to the embodiments presented and that these variants remain within the spirit and scope of the present invention.

Thus many modifications can be made by a person skilled in the art without for all that being excluded from the spirit and scope defined by the following claims.

What is claimed is:

1. A method of amplifying an input signal having a DC component and an AC component, including the following steps:

comparing the input signal with a reference value, generating an intermediate signal by subtracting from the input signal a correction signal resulting from said comparison step, rectifying the intermediate signal, evaluating a mean value of the rectified intermediate signal, and multiplying the input signal by said mean value.

2. A method as claimed in claim 1, characterized in that the value of said correction signal is equal to the reference value when the input signal is greater than the reference value and is equal to the value of the input signal when the input signal is lower than the reference value.

3. A method as claimed in claim 1, characterized in that the reference value is chosen in order to allow the elimination of an offset voltage of the input signal.

4. A device for amplifying an input signal having a DC component and an AC component, including:

a comparison module for comparing the input signal with a reference value, a generating module for generating an intermediate signal by subtracting from the input signal a correction signal resulting from said comparison, a rectifying module for rectifying the intermediate signal, an evaluating module for evaluating a mean value of the rectified intermediate signal, and a multiplying module for multiplying the input signal by said mean value.

5. A device as claimed in claim 4, characterized in that the value of said correction signal is equal to the reference value when the input signal is greater than the reference value and is equal to the value of the input signal when the input signal is lower than the reference value.

6. A device as claimed in claim 4, characterized in that the reference value is chosen in order to allow the elimination of an offset voltage of the input signal.

* * * * *